United States Patent
Mostowy, Jr. et al.

[11] Patent Number: 6,148,847
[45] Date of Patent: Nov. 21, 2000

[54] LOW VAPOR PRESSURE GAS DISTRIBUTION SYSTEM AND METHOD

[75] Inventors: Lewis J. Mostowy, Jr., Asbury; Yi-Lang Tsai, Hillsborough, both of N.J.

[73] Assignee: The BOC Group, Inc., New Providence, N.J.

[21] Appl. No.: 09/276,372

[22] Filed: Mar. 25, 1999

[51] Int. Cl.$^7$ ............................................. F04F 1/18
[52] U.S. Cl. ........................................ 137/209; 137/563
[58] Field of Search ................................. 137/209, 563

[56] References Cited

U.S. PATENT DOCUMENTS

| | | | |
|---|---|---|---|
| 4,235,829 | 11/1980 | Partus | 137/209 X |
| 4,859,375 | 8/1989 | Lipisko et al. | 137/209 X |
| 5,148,945 | 9/1992 | Geatz | 137/209 X |
| 5,160,429 | 11/1992 | Ohmi et al. | |
| 5,287,873 | 2/1994 | Venet | 137/209 X |
| 5,330,072 | 7/1994 | Ferri, Jr. et al. | 137/209 X |
| 5,417,346 | 5/1995 | Ferri, Jr. et al. | 137/209 X |
| 5,673,562 | 10/1997 | Friedt | |
| 6,019,114 | 2/2000 | Rodgers | 137/209 X |

OTHER PUBLICATIONS

Fine et al.–Seminconductor International, Oct. 1995, pp. 138–146.
Verma et al.–Seminconductor International, Jul. 1997, pp. 253–260.
Reppert et al.–Seminconductor International, Oct 1996, pp. 187–194.

*Primary Examiner*—John Rivell
*Attorney, Agent, or Firm*—Salvatore P. Pace

[57] ABSTRACT

A system and method for distributing a low vapor pressure gas to one or more points of use in which a recirculation path and a recirculation device are provided. The recirculation path includes a distribution conduit in communication with the point(s) of use to allow the low vapor pressure gas to continually circulate to and from the point(s) of use. The recirculation device is positioned within the recirculation path to circulate said low vapor pressure gas continually through said recirculation path. In such manner, the low vapor pressure gas may be circulated at low pressure to prevent condensation. Further, the low vapor pressure gas may be circulated as a saturated gas mixture with a carrier gas. This may be effectuated by sparging the carrier gas through a vessel containing a liquid phase of a substance making up the low vapor pressure gas. Further the temperature of such liquid phase may be controlled to prevent condensation of the low vapor pressure gas.

7 Claims, 2 Drawing Sheets

LOW VAPOR PRESSURE GAS DISTRIBUTION SYSTEM AND METHOD

BACKGROUND OF THE INVENTION

The present invention relates to a system and method for distributing a low vapor pressure gas to one or more points of use through a distribution conduit communicating at opposite ends with the head space of a vessel containing the low vapor pressure gas as a vapor phase of a substance. More particularly, the present invention relates to such a system and method in which the low pressure gas is continually circulated through the distribution conduit and the head space of the vessel.

In a variety of chemical processes, particularly those utilized in connection with semiconductor processing, high purity, low vapor pressure gases are distributed to points of use which can be the reaction chamber of a semiconductor production tool. These gases include: trichlorosilane ($SiHCl_3$) boron trichloride ($BCl_3$), hydrogen fluoride (HF), tungsten hexafluoride ($WF_6$) and silicon tetrachloride ($SiCl_4$). The invention also has applications for other gases used in the semiconductor industry for oxide-metal chemical vapor deposition, oxidation, doping, diffusion, ion implant, and the like. Where the vapor pressure of some aforementioned gases is below atmospheric pressure, they cannot be directly distributed to the process tooling. Instead, the particular gas to be distributed is introduced as a liquid into a vessel and a carrier gas is sparged into the liquid to produce a saturated vapor. The saturated vapor is then piped to various tools within the semiconductor production facility.

This aforementioned type of distribution is not without problems. Semiconductor factories are increasing in size, the distribution system must grow to meet the increased flow requirements. As demand varies in the facility, the saturated gas flow will also vary. At low flow rates, pipe line contents will tend to stratify thus causing separation of the carrier gas from the saturated vapor. In addition to the forgoing, since the liquid in the vessel can be warmer than the saturated gas in the distribution system, there will be some degree of liquid condensation within the pipeline. Such liquid condensation can also occur due to pressure variations within the pipeline. The appearance of liquid can in turn cause an automatic shutdown of certain semiconductor processing tools and thus, an expensive lapse in production capability.

As will be discussed, the present invention provides method apparatus in which a saturated gas is formed and distributed in a manner that is less susceptible to liquid condensation than prior art methods of distribution.

SUMMARY OF THE INVENTION

The present invention provides a gas distribution system for distributing a low vapor pressure gas to at least one point of use. In accordance with the invention, a recirculation path is provided that includes a distribution conduit in communication with the at least one point of use to allow said low vapor pressure gas to continually circulate to and from the at least one point of use. A recirculation device is positioned within the recirculation path to circulate said low vapor pressure gas continually through the recirculation path.

The recirculation path may include a vessel for containing at least liquid and vapor phases of a substance with the vapor phase of said substance forming the low vapor pressure gas. In such case, the distribution conduit communicates at opposite ends with a head space of said vessel and the recirculation device is positioned to circulate the low vapor pressure gas continually through said distribution conduit and said head space of said vessel. The recirculation device may advantageously be positioned at one of the opposite ends of the distribution conduit so that said low vapor pressure gas is drawn through the distribution conduit and is discharged therefrom into the vessel, thereby to maintain said distribution conduit at a pressure lower than that of the vessel. In such aspect of the present invention a means may be provided for introducing a carrier gas into the liquid to produce a saturated gas in the head space with the saturated gas containing the vapor phase of the substance. In all cases, the recirculation device may be a blower and a means may be provided to control temperature within the vessel to inhibit condensation of the low vapor pressure gas within the distribution conduit.

In yet another aspect, the present invention provides a method of distributing a low vapor pressure gas to at least one point of use. In accordance with such aspect, the low vapor pressure gas is continually circulated to and from the at least one point of use through a recirculation path having a distribution conduit communicating with the at least one point of use.

The low vapor pressure gas may be contained within a vessel as a vapor phase of a substance existing in equilibrium with a liquid phase of said substance. In such case, the recirculation path includes a head space of said vessel containing the vapor phase and the distribution conduit communicates at opposite ends with the head space of said vessel. The low vapor pressure gas is thereby continually circulated from a head space of the vessel to the least one point of use and then from the at least one point of use back to the head space of said vessel through the distribution conduit.

The low vapor pressure gas may be circulated at a pressure below that of the vessel to prevent condensation of the low vapor pressure gas. Further, the a carrier gas may be introduced into the liquid to produce a saturated gas in the head space. In such aspect of the invention, the saturated gas contains the vapor phase of said substance and therefore, said low vapor pressure gas, and the saturated gas is recirculated through the recirculation path, thereby to circulate said low vapor pressure gas. The temperature of the vessel may be controlled to prevent condensation of the low vapor pressure gas within the distribution conduit.

Since the low vapor pressure gas is continually moving through the recirculation loop there is less of a possibility of stratification then prior art methods of distribution. Advantageously, such circulation may be employed in a bulk distribution system in which the low vapor pressure gas is circulated from a head space of a vessel and through the recirculation path by a recirculation device drawing the low vapor pressure gas through a distribution conduit thereof at a lower pressure then the head space of the vessel. Such low pressure circulation will help to inhibit condensation of the low vapor pressure gas by maintaining a lower total pressure in the distribution system than the saturated vapor pressure in the vessel. Further, the temperature of the vessel may be be controlled to prevent condensation. This may involve cooling the vessel to a temperature below ambient or under certain process conditions warming the vessel due to evaporative cooling.

BRIEF DESCRIPTION OF THE DRAWINGS

While the specification concludes with claims distinctly pointing out the subject matter that applicants regard as their invention, it is believed that the invention will be better understood when taken in connection with the accompanying drawings in which:

DETAILED DESCRIPTION

Figure 1:
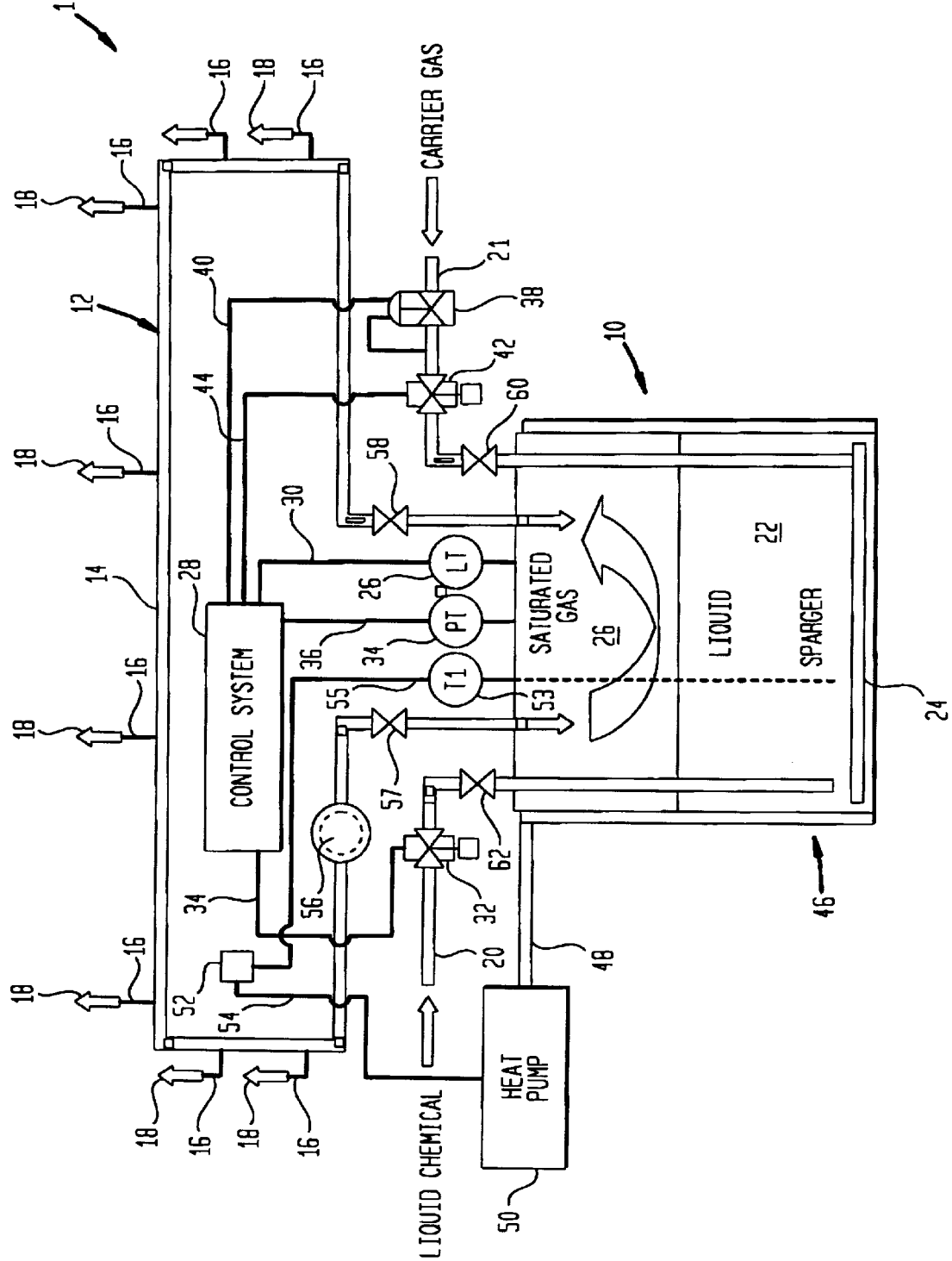
FIG. 1 is a schematic view of an apparatus for carrying out a method in accordance with the present invention.

With reference to FIG. 1, a distribution system 1 is illustrated. Distribution system 1 is provided with a vessel 10 in which the saturated gas is circulated in a distribution conduit 12 having a recirculation loop 14 and branches 16 branching from recirculation loop 14. The saturated gas, containing a low vapor pressure gas, flows through branches 16 and then to points of use indicated by arrowheads and designated by reference numerals 18. Distribution conduit communicates at opposite ends with a head space region of vessel 10 containing the saturated gas and the saturated gas is continually circulated through a recirculation path including the head space of vessel 10 and distribution conduit 12 to and from points of use 18 by means of a circulation device such as a blower 56 which will be discussed in more detail, hereinafter.

Figure 2:
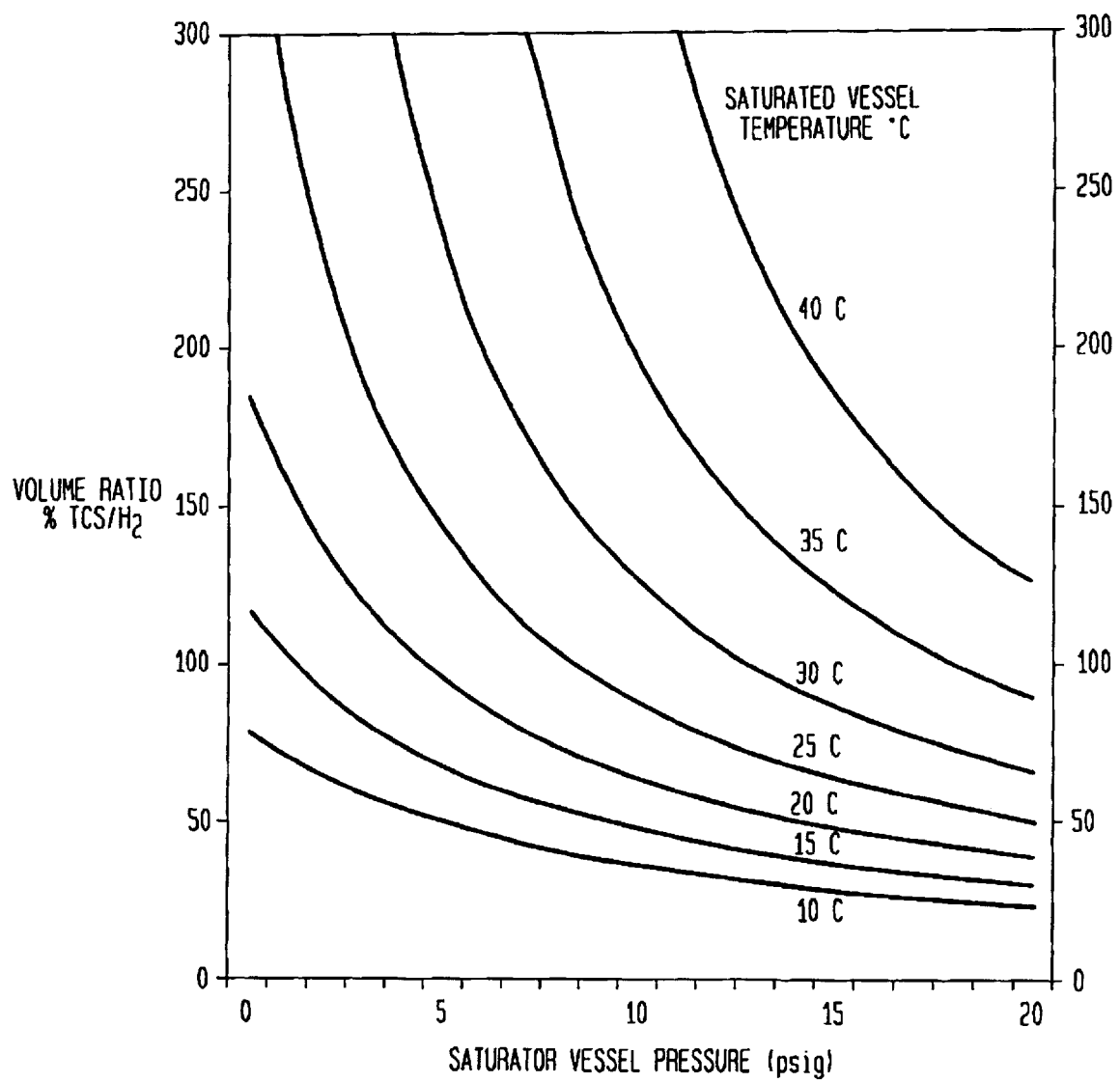
FIG. 2 is a chart of the volume ratio of trichlorosilane in a hydrogen carrier gas versus vessel pressure and temperature.

Distribution system 1 is designed to distribute a variety of low vapor pressure gases, for example trichlorosilane. With additional reference to FIG. 2, the volume ratio of trichlorosilane within hydrogen (a carrier gas) is charted against vessel pressure and temperature within vessel 10. As is evident from such chart, the lower the pressure, the higher the volume ratio. Therefore, the distribution of trichlorosilane within a hydrogen carrier gas at low pressure allows more trichlorosilane to be distributed and therefore, a greater amount of production for a semiconductor fabrication facility. Such distribution is difficult to achieve in prior-art bulk distribution systems since the driving force for such systems is supplied by positive pressure within a supply vessel. As will become apparent, distribution system 1 is designed to effectuate distribution of a low vapor pressure gas at a low pressure and therefore allow for a greater degree of saturation than prior art devices.

Liquid chemical (for instance, trichlorosilane) is introduced into vessel 10 through a supply conduit 20 to form a volume of liquid 22 in vessel 10. A carrier gas (for instance hydrogen in case of trichlorosilane) is introduced, via a carrier gas conduit 21, into the volume of liquid 22. Carrier gas conduit 21 is connected to a sparger 24 located in the bottom of vessel 10 to sparge the carrier gas through liquid 22 and thereby form a saturated gas within a head space region 26 of vessel 10.

The liquid level of liquid 22 is controlled by sensing liquid level by a level detector 26. Level detector 26 is connected to a control system 28 by an electrical connection 30. Control system 28 appropriately activates a remotely controlled valve 32 by means of an electrical connection 34 when the liquid level is below level detector 26 to allow the liquid chemical into vessel 10. Pressure within vessel 10 is sensed by a pressure transducer 34 connected by an electrical connection 36 to controller 28. Controller 28, in response to the pressure indication, appropriately adjusts a remotely activated pressure control valve 38 through an electrical connection 40 provided for such purpose. Control system 28 also be set to cut off the flow of carrier gas in carrier gas conduit 21 by means of a cutoff valve 42 connected by an electrical connection 44 to control system 28.

It is to be noted that control system 28 maybe anyone of a number commercially available devices known as a programmable logic computers or a PC that is programmed with a commercially available program and appropriately fitted with I/O devices to accommodate the aforementioned electrical connections and inputs and outputs necessary to effectuate the control. In this regard, control system 28 might be independent level and pressure controllers of the types known in the art.

Vessel 10 is jacketed by a cooling jacket 46 which is supplied with a heat transfer fluid by a conduit 48. The heat transfer fluid is produced by a heat pump 50. Heat pump 50 is also controlled by a temperature controller 52 connected thereto by an electrical connection 54. Temperature controller 52 is connected to a temperature sensor 53 by a connection 55 to sense temperature within liquid 22 and thereby control such temperature to be a few degrees below ambient temperature. In such manner, the temperature of the saturated gas is controlled to be less than the recirculation conduit 12 which takes on the temperature of the ambient to inhibit condensation of the low vapor pressure gas. In this regard, due to evaporative cooling vessel 10 might have to be heated to maintain the desired temperature spread with the ambient. In other operational conditions, vessel 10 would be cooled.

Blower 56 circulates saturated gas within head space 26 and circulation loop 14 so that the saturated gas is in continual motion. A magnetically coupled centrifugal blower will provide the seal-less requirements for this application. An ejector, as well as various circulation devices, might also be used in place of blower 52. In any event, the circulation device utilized, through its placement, necessarily lowers the pressure within recirculation loop 14 below that of head space 26.

Typically, saturated gas is circulated at a rate of about 5 liters per minute the process pressure of 0–30 psig. Thus, control system 28 controls pressure regulation valve 38 so that pressure as sensed by pressure sensor 34 approximately 30 psig. The temperature set point of temperature controller 52 will be set to maintain a temperature of liquid 22 of between about 5° and about 30° C., more commonly between about 10° C. and about 25° C. The flow rate of the circulation flow, depending upon processing requirements will vary between about 0.1 and about 50 standard liters per minute and more preferably be about 1 and about 5 standard liters per minute.

Vessel 10 and its contents can be isolated from recirculation loop 14 by means of manually activated isolation valves 57 and 58. Carrier gas conduit 21 can be manually cutoff by an isolation valve 60 and vessel 10 can be isolated from the liquid chemical supply by way of an isolation valve 62 located within chemical conduit 20.

It is to be noted, that the present invention has applications that exceed the distribution system illustrated and described above. For instance, the present invention is equally applicable to systems in which the particular low pressure gas is made on site in a generator. In such case it is very practical to envision a recirculation path in which the low vapor pressure gas is continually being recirculated within a conduit that is connected to the processing chamber of the tool itself rather than the head space of a separate vessel such as vessel 10.

Although the present invention has been described by reference to a preferred embodiment, as will occur to those skilled in the art, numerous changes, additions and omissions may be made without departed from the spirit and scope of the present invention.

We claim:

1. A system for distributing a low vapor pressure gas from a vessel containing at least liquid and vapor phases of a substance, said vapor phase of said substance forming said low pressure gas, to at least one point of use comprising:

a recirculation path including a distribution conduit in communication with the at least one point of use and said vessel, said distribution conduit being in communication with and at opposite ends of a head space of said vessel: and a recirculation device positioned within the recirculation path to circulate said low vapor pressure gas continually through said recirculation path, said recirculation device being positioned at one of said opposite ends of said head space such that said low vapor pressure gas is drawn through said distribution conduit and is discharged therefrom into said vessel, thereby maintaining said distribution conduit at a pressure lower than that of said vessel.

2. The system of claim 1, further comprising means for introducing a carrier gas into said liquid phase in said vessel to produce a saturated gas in said head space containing said vapor phase of said substance.

3. The system of claim 1, wherein said recirculation device is a blower.

4. The system of claim 3 further comprising means for controlling temperature of said vessel to inhibit condensation of said low vapor pressure gas within said distribution conduit.

5. A method for distributing a low vapor pressure gas from a vessel containing at least liquid and vapor phases of a substance, said vapor phase of said substance forming said low pressure gas in a head space of said vessel, to at least one point of use comprising:

continually circulating said low pressure gas to and from said at least one point of use through a recirculation path including a distribution conduit in communication with the at least one point of use and opposite ends of said head space of the vessel, wherein said low pressure gas is circulated by a recirculation device positioned at one of said opposite ends of said head space such that said low vapor pressure gas is drawn through said distribution conduit and is discharged therefrom into said vessel, thereby maintaining said distribution conduit at a pressure lower than that of said vessel.

6. The method of claim 5, further comprising introducing a carrier gas into said liquid phase in said vessel to produce a saturated gas in said head space containing said vapor phase of said substance, and therefore said low vapor pressure gas, and circulating said saturated gas through said recirculation path, thereby circulating said low pressure gas.

7. The method of claim 6, additionally including controlling the temperature of said vessel so that it is lower than said distribution conduit thereby inhibiting condensation of said low vapor pressure gas within said distribution conduit.

* * * * *